United States Patent [19]

Cygan et al.

[11] Patent Number: 4,504,886
[45] Date of Patent: Mar. 12, 1985

[54] GROUNDING AND POSITIONING CLIP FOR A POWER TRANSISTOR

[75] Inventors: Lawrence F. Cygan, Schaumburg; Raul Olivera, Hoffman Estates; John F. Pottle, West Chicago, all of Ill.

[73] Assignee: Motorola Inc., Schaumburg, Ill.

[21] Appl. No.: 470,809

[22] Filed: Feb. 28, 1983

[51] Int. Cl.³ ............................................. H05K 7/20
[52] U.S. Cl. .................................... 361/386; 361/412; 357/81
[58] Field of Search ................. 357/81; 361/308, 380, 361/383–389, 412, 427

[56] References Cited

U.S. PATENT DOCUMENTS 4,321,423  3/1982  Johnson .............................. 361/386
4,446,504  5/1984  Jordan .................................. 361/386

Primary Examiner—G. P. Tolin
Attorney, Agent, or Firm—Donald B. Southard; John B. Conklin; James W. Gillman

[57] ABSTRACT

The invention is a grounding/positioning clip for providing a DC ground return path, low inductance AC ground path between circuit boards and for positioning electronic components in relation to an electronic device. The assembly includes a heat spreader with an electronic device mounted thereon. The leads of the electronic device are physically and electrically attached to first and second circuit boards. A clip, which has electronic components mounted thereon, fits over the electronic device thereby positioning the electronic components in correct physical relationship to the electronic device and the first and second circuit boards. Also the clip acts as a low inductance AC ground path between the first and second circuit boards and also provides a DC ground path. Preferably the electronic device is a power transistor and the electronic components mounted on the clip are miniature compression mica capacitors for RF matching. The clip is preferably formed of sheet metal with a good conductor such as copper plated on the surface.

5 Claims, 5 Drawing Figures

GOUNDING AND POSITIONING CLIP FOR A POWER TRANSISTOR

BACKGROUND OF THE INVENTION

The invention is a grounding/positioning clip for positioning matching capacitors relative to a power transistor on input and output substrates. In particular, the clip includes miniature compression mica capacitors attached to the clip by either high temperature soldering or spot welding. The clip is placed over a power transistor cap and soldered to ground plating on the input and output substrates which are associated with the power transistor. The miniature compression mica capacitors are also soldered to plating on the substrates or the transistor leads.

In the prior art, hand placement was employed and hand soldering was used to physically install RF matching capacitors in close proximity to the RF power transistor in a RF device. Proper placement of the RF matching capacitors is critical to the electrical performance of the circuit. Reliable and repeatable proper placement of the RF matching capacitors is critical in any practical commerical product assembly. The inaccuracies inherent in the two hand operation of hand placement and hand soldering, results in suboptimal electrical performance and unsatisfactory yield. Proper circuit operation requires a physically short, low inductance ground path between the input and output circuits of the power amp. In the prior art this was accomplished by two individual ground straps, such as a flat wire conductor or copper connecting wire soldered across the gap between the input and output substrates of the power transistor. The prior art method of creating a ground path between the input and output circuits was labor intensive since it involved the hand soldering of ground straps of some type. A DC ground return path must also be provided for proper circuit operation of the power transistor circuit. Traditionally, this DC ground path was provided by a buss bar or a printed circuit board trace. The invention eliminates the need for a buss bar or printed circuit board trace by permitting the use of the chassis or heatsink as a DC ground connection via the body of the positioning clip. The invention thereby reduces labor and cost since no separate DC ground connection is required.

It is the object of this invention to provide an RF power transistor clip with preassembled capacitors which repeatably are locatable in their proper physical placement for proper RF matching.

It is a further object of the invention to eliminate the considerable hand labor needed during circuitry assembly of a RF power transistor circuit while providing a physically short low inductance ground connection between the input and output circuit substrates of the power transistor and a DC ground return path.

SUMMARY OF THE INVENTION

The invention is a grounding/positioning clip for providing a DC ground return path, low inductance AC ground path between circuit boards and for positioning electronic components in relation to an electronic device. The assembly includes a heat spreader with an electronic device mounted thereon. The leads of the electronic device are physically and electrically attached to first and second circuit boards. A clip, which has electronic components mounted thereon, fits over the electronic device thereby positioning the electronic components in correct physical relationship to the electronic device and the first and second circuit boards. Also the clip acts as a low inductance AC ground path between the first and second circuit boards and also provides a DC ground path. Preferably the electronic device is a power transistor and the electronic components mounted on the clip are miniature compression mica capacitors for RF matching. The clip is preferably formed of sheet metal with a good conductor such as copper plated on the surface. The clip can also be formed of solid brass or pure copper.

DESCRIPTION OF THE PREFERRED EMBODIMENT

Figure 1:
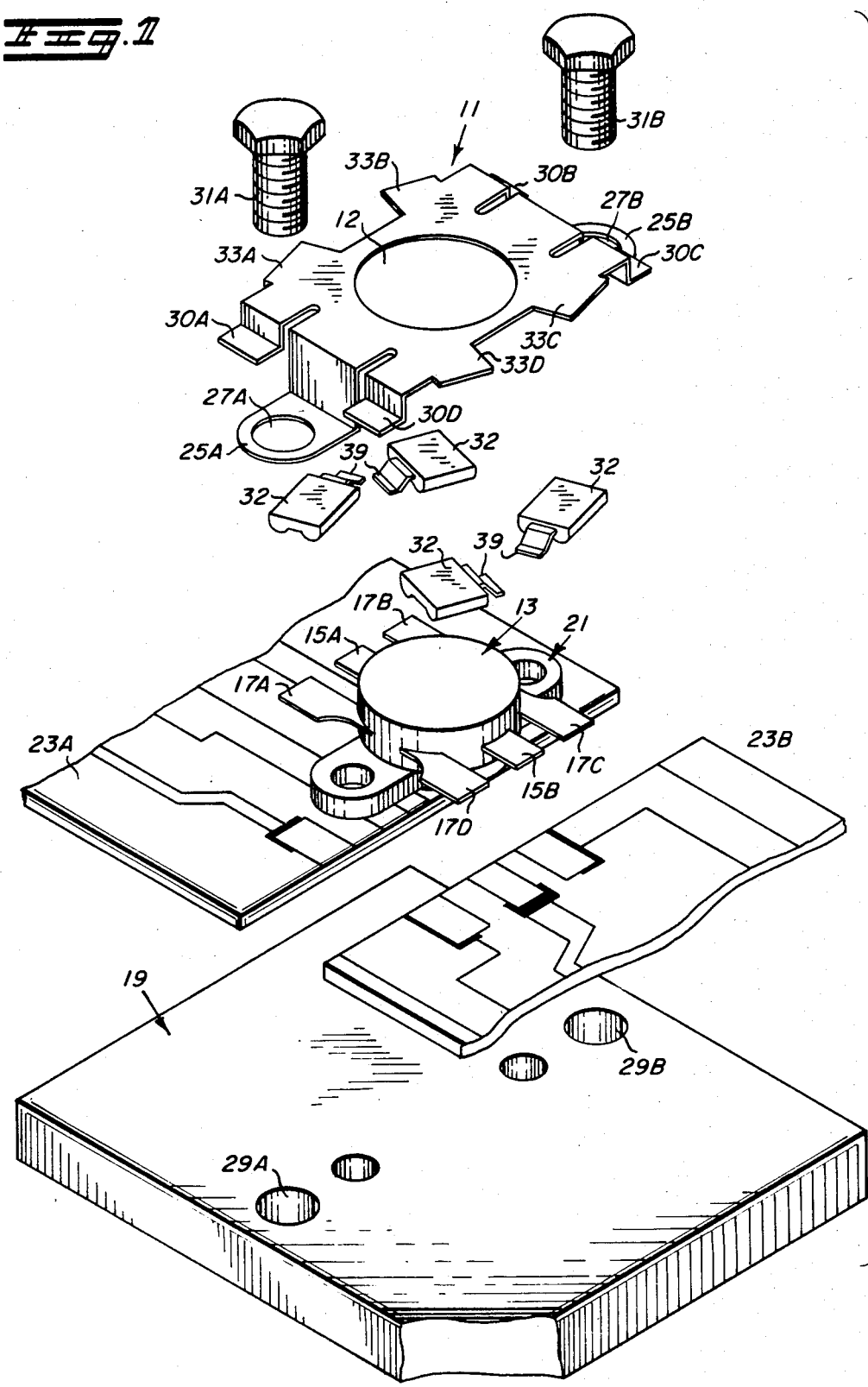
FIG. 1 is an exploded perspective view of the positioning/grounding clip assembly according to the invention.

FIG. 1 is an exploded perspective view of the positioning/grounding clip assembly according to the invention. The grounding/positioning clip itself is shown as 11 in FIG. 1. The clip has a centrally located hole 12 which fits around an annularly shaped power transistor 13. The clip is composed of a conductor preferably a thin gauge sheet metal which is stamped to the shape shown in FIG. 1. Preferably, the clip is copper plated but it does not need to be plated for proper operation. The power transistor 13 has top and bottom flat surfaces connected by an annular side causing the power transistor 13 to have an overall flat circular shape. The power transistor 13 has two leads 15a and 15b located at opposite points on the circumference of the power transistor. Leads 17a and 17b are located adjacent to lead 15a. Leads 17c and 17d are located adjacent to lead 15b. Leads 17a-17d are the emitter of the power transistor 13. The transistor 13 is physically and thermally connected to a copper alloy heat spreader 19 by way of a transistor flange 21. The copper alloy heat spreader 19 has a top and bottom flat or planar surface connected by four side portions which give the heat spreader 19 a flat square shape. It should be noted that the heat spreader may have other shapes, but the shape shown in FIG. 1 is preferred. The transistor 13 is soldered to the heat spreader 19 at the transistor flange 21. Preferably the transistor flange 21 is made of a good conductor which can be soldered to the heat spreader 19.

The transistor flange 21 is integral with the power transistor 13. Leads 15a, 15b and 17a-17d of the power transistor 13 are connected to circuitry on printed circuit boards 23a and 23b. The positioning/grounding clip 11 fits over the power transistor 13. Two leg portions 25a and 25b of the positioning/grounding clip 11 have holes 27a and 27b respectively which line up with holes 29a and 29b on the copper alloy heat spreader 19. The positioning/grounding clip 11 is soldered to the printed circuit boards 23a and 23b at feet portions 30a-30d of the clip. The positioning/grounding clip 11 four feet portions 30a, 30b, 30c and 30d are located adjacent to miniature compression mica capacitor locations 33a, 33b, 33c and 33d. Each comprise two right angle sections to form a foot whose bottom portion is soldered onto one of the printed circuit boards 23a or 23b. The foot portions 30a and 30b contact the printed circuit board 23a and foot portions 30c and 30d contact the printed circuit board 23b. Preferably the feet portions 30a–30d connect the electrical AC and DC grounds on the two circuit boards. Therefore the clip 11 acts as both a DC ground and a low inductance AC ground path to connect the ground planes of both circuit boards. Two thread forming bolts 31a and 31b ensure a good DC connection by holding the soldered assembly of positioning/grounding clip 11, transistor 13, heat spreader 19 and circuit boards 23a and 23b in place on the top surface of a chassis or heatsink.

Figure 4:
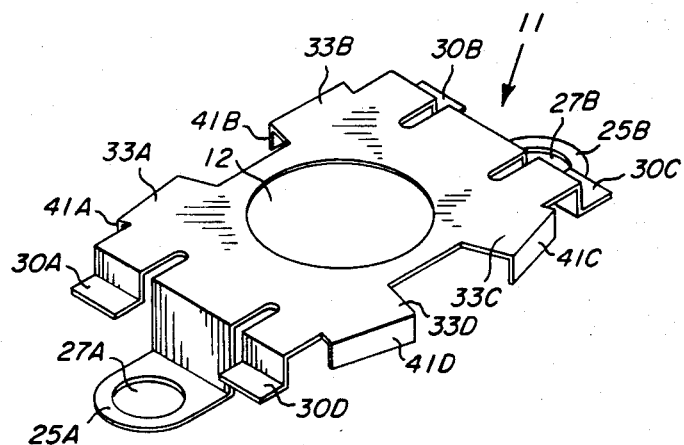
FIGS. 4 and 4a are perspective views of alternate embodiments of the positioning/grounding clip according to the invention.

At four locations on the underside of the positioning/grounding clip 11, a miniature compression mica capacitor 32 is spot welded or soldered into place. In FIG. 1 the locations are designated 33a, 33b, 33c and 33d. The mica capacitor housing has basically a flat rectangular shape. The mica capacitor housing serves as a grounding lead. The housing is the mica capacitor portion which is directly soldered or spot welded to the positioning/grounding clip 11. A lead 39 for the mica capacitors is located on one side of the capacitor housing 32. By precisely positioning the mica capacitor housing 32 on the clip, the lead 39 of the mica capacitor will mate with the printed circuit board 23a and 23b at the necessary point on the printed circuit. The physical placement of the mica capacitors is important since the capacitors are used for impedance matching in a RF system. By first mounting the mica capacitors to the positioning/grounding clip 11, the prior art method of hand placement and hand soldering the mica capacitors to the printed circuit board has been eliminated. The hand placement and soldering resulted in sub-optimal placement of the mica capacitors and correspondingly sub-optimal RF matching. In addition, the hand placement and soldering resulted in a wide performance variation between power transistor assemblies. Preferably an assembly fixture is used to position and hold the mica capacitors 32 on the clip 11 during the soldering or spot welding process. Alternately positioning can be accomplished as shown in FIG. 4.

The heat spreader 19 is mounted onto a conventional heat sink assembly. With the heat spreader 19 composed of highly conductive copper, the spreader is able to distribute the power transistors dissipated heat over a large region of the heat sink. This results in more effective heat dissipation from the power transistor. The heat sink assembly is usually constructed of zinc or magnesium which is not as good a conductor as copper. Construction of the whole heat sink assembly from copper is cost prohibitive for most applications. Therefore, in the invention, it is preferred to use a copper heat spreader in combination with a conventional zinc or magnesium heat sink assembly. As an alternate embodiment the transistor flange 21 can be directly coupled to a heat sink assembly thereby eliminating the heat spreader 19. This is not preferred since the copper heat spreader gives significant improvement in heat dissipation. Bolts 31a and 31b serve to secure the heat spreader 19 to the main heat sink assembly.

Figure 2:
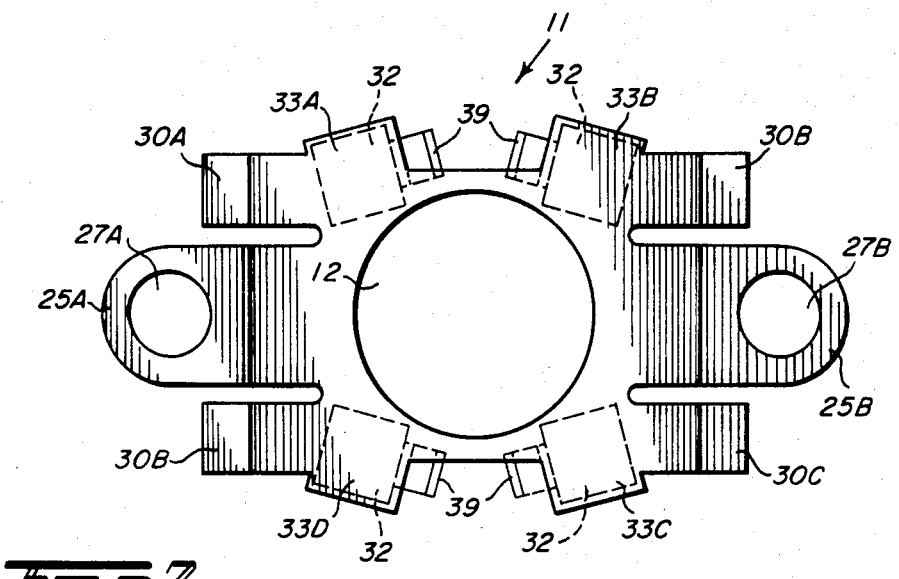
FIG. 2 is a top view of the positioning/grounding clip of FIG. 1.

FIG. 2 is a top view of the positioning/grounding clip 11 of FIG. 1. The annular shaped power transistor 13 fits through the hole 12 of the clip 11. The four locations 33a, 33b, 33c and 33d indicate the position of the mica capacitors on the underside of the clip 11. The mica capacitor leads 39 connect the mica capacitors to the printed circuit on printed circuit boards 23a and 23b and/or the transistor leads. The central holes 27a and 27b in legs 25a and 25b receive screws (shown as 31a and 31b in FIG. 1) which mechanically and electrically secure the clip 11 to the heat sink spreader 19 and ultimately to the heat sink. Feet portions 30a, 30b, 30c and 30d are in a soldered connection with the ground planes of the printed circuit boards 23a and 23b. The feet portions 30a and 30b provide a DC ground and a low inductance AC ground path from the ground plane of the printed circuit board 23a through the feet portions 30c and 30d to the ground plane of the printed circuit board 23b.

Figure 3:
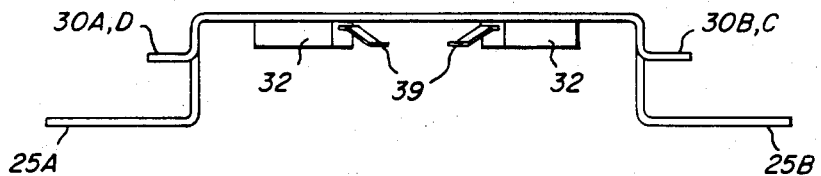
FIG. 3 is a side view of the positioning/grounding clip of FIG. 2.

FIG. 3 is a side view of the positioning/grounding clip 11. The side view clearly shows the different length of the feet portions 30a, 30b, 30c and 30d in comparison to the legs 25a and 25b. The feet portions 30a, 30b 30c and 30d are in a common horizontal plane as the ends of the leads 39 from the mica capacitors 32. This results from the fact that both the feet 30a–30d and the leads 39 are soldered to points on the surface of the circuit boards 23a or 23b. The legs 25a and 25b are secured to the heat spreader 19 which has a top surface in the assembly shown in FIG. 1 which is located beneath the circuit boards 23a and 23b. Therefore the legs 25a and 25b, although of the same general angular shape as the feet 30a, 30b, 30c and 30d, have a much longer vertical portion in order for the horizontal portion of the legs to contact the top surface of the heat spreader 19.

FIG. 4 is an alternate embodiment of the clip 11 in FIG. 1. Preferably the mica capacitors are located on the surface of clip 11 by way of an assembly fixture which holds the mica capacitors in position on the clip while they are spot welded or soldered. FIG. 4 shows flange portions 41a–d which are part of the clip 11 and are located proximate to the four positions for the mica capacitors. The flanges serve as alignment guides for placement of the mica capacitors. By butting one side of a mica capacitor up against a flange 41, the capacitor is precisely located and can be soldered or spot welded into place.

Figure 4A:
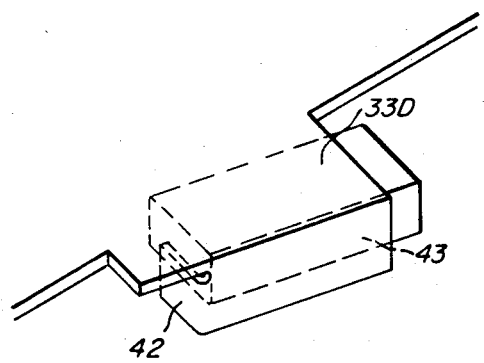

FIG. 4a shows a second alternate embodiment which may be configured by bending in at right angles a portion 42 of the flange portions 41a–d. This configuration will permit the use of monolithic chip capacitors instead of compression mica capacitors with the clip.

In summary the invention is an electronic assembly which includes a clip which provides precise positioning of electronic components in relation to an electronic device such as a power transistor while the clip simultaneously functions as a DC ground and a low inductance AC grounding path between portions of the electronic assembly.

What is claimed is:

1. A positioning/grounding assembly for providing a DC ground and a low inductance AC ground path and for positioning electronic components, said assembly comprising,
   a thermal conductive medium,
   a first electronic device mounted on said thermal conductive medium, said first electronic device having at least first and second leads,
   first and second printed circuit boards receiving said first and second leads respectively,
   a clip positioned over said first electronic device,
   a second electronic device physically and electrically attached to said clip whereby positioning said clip over said first electronic device places said second electronic device in correct physical placement relative to said first electronic device and said first and second printed circuit boards.

2. A positioning/grounding assembly according to claim 1 wherein said clip electrically connects said first and second circuit board, said thermally conductive medium and said second electronic device.

3. A positioning/grounding assembly according to claim 1 wherein said first electronic device is a power transistor.

4. A positioning/grounding assembly according to claim 1 wherein said second electronic device is a compression mica capacitor which provides RF matching for said first electronic device.

5. A positioning/grounding assembly according to claim 1 wherein said clip includes flange portions for aligning said second electronic device on said clip.

* * * * *